United States Patent
Allen et al.

(10) Patent No.: US 6,222,394 B1
(45) Date of Patent: Apr. 24, 2001

(54) SOI CMOS SENSE AMPLIFIER WITH ENHANCED MATCHING CHARACTERISTICS AND SENSE POINT TOLERANCE

(75) Inventors: David Howard Allen, Rochester, MN (US); Ching-Te Kent Chuang, South Salem, NY (US); Jente Benedict Kuang, Lakeville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/498,387

(22) Filed: Feb. 3, 2000

(51) Int. Cl.[7] .................................................. H03F 3/45
(52) U.S. Cl. .............................. 327/52; 327/55
(58) Field of Search ........................... 327/51, 52, 55, 327/57, 65, 534, 537

(56) References Cited

U.S. PATENT DOCUMENTS 5,581,106 * 12/1996 Hayashi et al. ...................... 257/369
6,037,808 * 3/2000 Houston et al. ...................... 327/55
6,061,267 * 5/2000 Houston ............................. 365/154

* cited by examiner

Primary Examiner—Tuan T. Lam
Assistant Examiner—Hiep Nguyen
(74) Attorney, Agent, or Firm—Joan Pennington

(57) ABSTRACT

A silicon-on-insulator (SOI) complementary metal oxide semiconductor (CMOS) sense amplifier is provided with improved matching characteristics and sense point tolerance under no penalty of performance degradation. The sense amplifier includes a silicon-on-insulator (SOI) field effect transistor. A flooding field effect transistor is coupled to a body of the silicon-on-insulator (SOI) field effect transistor. The flooding field effect transistor is activated before the sense amplifier is set. The flooding field effect transistor has an opposite polarity of the silicon-on-insulator (SOI) field effect transistor. The flooding field effect transistor provides a charging path to a voltage supply rail. A pair of flooding field effect transistors serve as charging to voltage supply rail elements for silicon-on-insulator (SOI) field effect transistors on each side of complementary bitline structures of the sense amplifier. The flooding field effect transistor is substantially smaller than the silicon-on-insulator (SOI) field effect transistor.

13 Claims, 6 Drawing Sheets

SOI CMOS SENSE AMPLIFIER WITH ENHANCED MATCHING CHARACTERISTICS AND SENSE POINT TOLERANCE

FIELD OF THE INVENTION

The present invention relates to a silicon-on-insulator (SOI) complementary metal oxide semiconductor (CMOS) sense amplifier with improved matching characteristics and sense point tolerance.

DESCRIPTION OF THE RELATED ART

Silicon-on-insulator (SOI) technology is an enhanced silicon technology currently being utilized to increase the performance of digital logic circuits. By utilizing SOI technology, designers can increase the speed of digital logic integrated circuits or can reduce their overall power consumption. These advances in technology will lead to the development of more complex and faster computer integrated circuits that operate with less power.

As shown in FIG. 1, SOI semiconductors include a thin layer of silicon placed on top of an insulator, such as silicon dioxide ($SiO_2$) or glass, and a MOS transistor built on top of this structure. The main advantage of constructing the MOS transistor on top of an insulator layer is to reduce the internal capacitance of the transistor. This is accomplished by placing the insulator oxide layer between the silicon substrate and the impurities required for the device to operate as a transistor. Reducing the internal capacitance of the transistor increases its operating speed. With SOI technology, faster MOS transistors can be manufactured resulting in faster electronic devices.

A problem called bipolar discharge exists with SOI FETs. An inherent drawback of placing a MOS transistor on top of a SOI layer is that the MOS transistor is actually placed in parallel with a parasitic bipolar junction transistor, as illustrated in FIG. 2. The parasitic bipolar transistor can cause the unwanted effect called bipolar discharge, which alters the speed and lowers noise margin in a dynamic CMOS circuit.

Normally, parasitic bipolar action does not manifest itself in conventional bulk CMOS transistors because the base of the bipolar transistor is always kept at ground potential, keeping the bipolar transistor turned off. In the SOI FET, the body (B) of the MOS FET device, or base of the bipolar transistor, is floating and can be charged high by junction leakages induced when, both drain (D) and source (S) terminals of the MOS FET are at a high potential. Subsequently, if the source (S) is pulled to a low potential, the trapped charge in the body (B) is available as base current for the parasitic bipolar transistor. The parasitic base current activates the bipolar transistor and generates a collector current at the drain terminal of the MOS FET. This collector current flow in the bipolar junction transistor or bipolar discharge is undesirable since it causes an unintended loss of charge on the drain node of a dynamic circuit. Such bipolar discharge reduces the noise margin of the dynamic circuit and can result in the functional failure.

Dynamic and dual rail silicon-on-insulator (SOI) complementary metal oxide semiconductor (CMOS) circuits are prone to performance variation and mismatch in transfer characteristics due to body potential and threshold voltage differentials. This is a direct result of circuit operating history and dissimilar time constants to charge and discharge field effect transistor (FET) bodies as compared with the actual access times or cycle times. Repetitive read operations performed on a sense amplifier over time can result in significant body potential bias, and consequently mismatches in FET threshold voltage and amplifier transfer characteristics. This degrades the circuit noise margin, reduces the differential gain and switching sensitivity of the amplifier, lowers performance, and can potentially cause logic faults.

A need exists for a silicon-on-insulator (SOI) complementary metal oxide semiconductor (CMOS) sense amplifier with improved matching characteristics and sense point tolerance.

SUMMARY OF THE INVENTION

A principal object of the present invention is to provide a silicon-on-insulator (SOI) complementary metal oxide semiconductor (CMOS) sense amplifier with improved matching characteristics and sense point tolerance. Other important objects of the present invention are to provide such a silicon-on-insulator (SOI) complementary metal oxide semiconductor (CMOS) sense amplifier with improved matching characteristics and sense point tolerance substantially without negative effect and that overcome many of the disadvantages of prior art arrangements.

In brief, a silicon-on-insulator (SOI) complementary metal oxide semiconductor (CMOS) sense amplifier is provided with improved matching characteristics and sense point tolerance while simultaneously achieving high performance. The sense amplifier includes a silicon-on-insulator (SOI) field effect transistor. A flooding field effect transistor is coupled to a body of the silicon-on-insulator (SOI) field effect transistor. The flooding field effect transistor is activated before the sense amplifier is set.

In accordance with features of the invention, the flooding field effect transistor has an opposite polarity of the silicon-on-insulator (SOI) field effect transistor. The flooding field effect transistor provides a charging path to a voltage supply rail. A pair of flooding field effect transistors serve as charging to voltage supply rail elements for silicon-on-insulator (SOI) field effect transistors on each side of complementary bitline structures of the sense amplifier. The flooding field effect transistor is substantially smaller than the silicon-on-insulator (SOI) field effect transistor.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
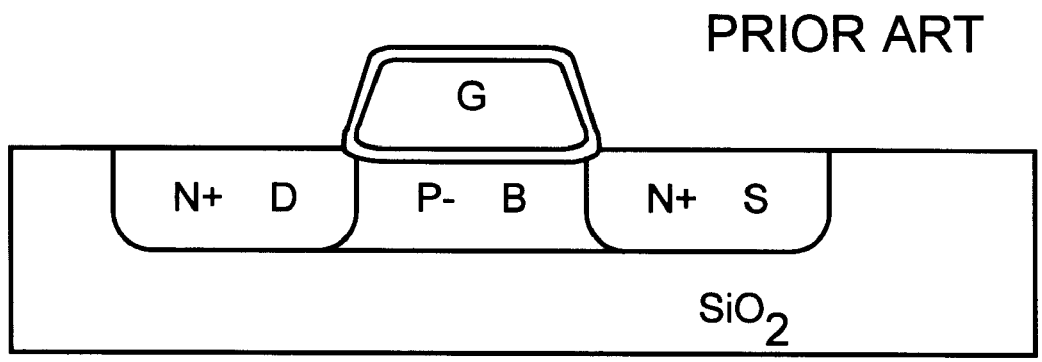
FIG. 1 is a cross sectional view illustrating a silicon-on-insulator (SOI) N-channel field effect transistor (NFET)
Figure 2:
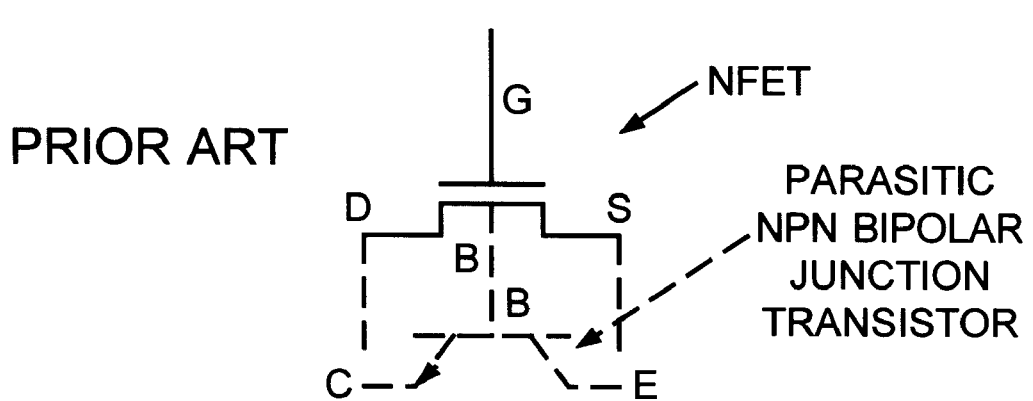
FIG. 2 is a schematic diagram illustrating the silicon-on-insulator (SOI) N-channel field effect transistor (NFET) of FIG. 1 including a parasitic bipolar junction transistor.
Figure 3:
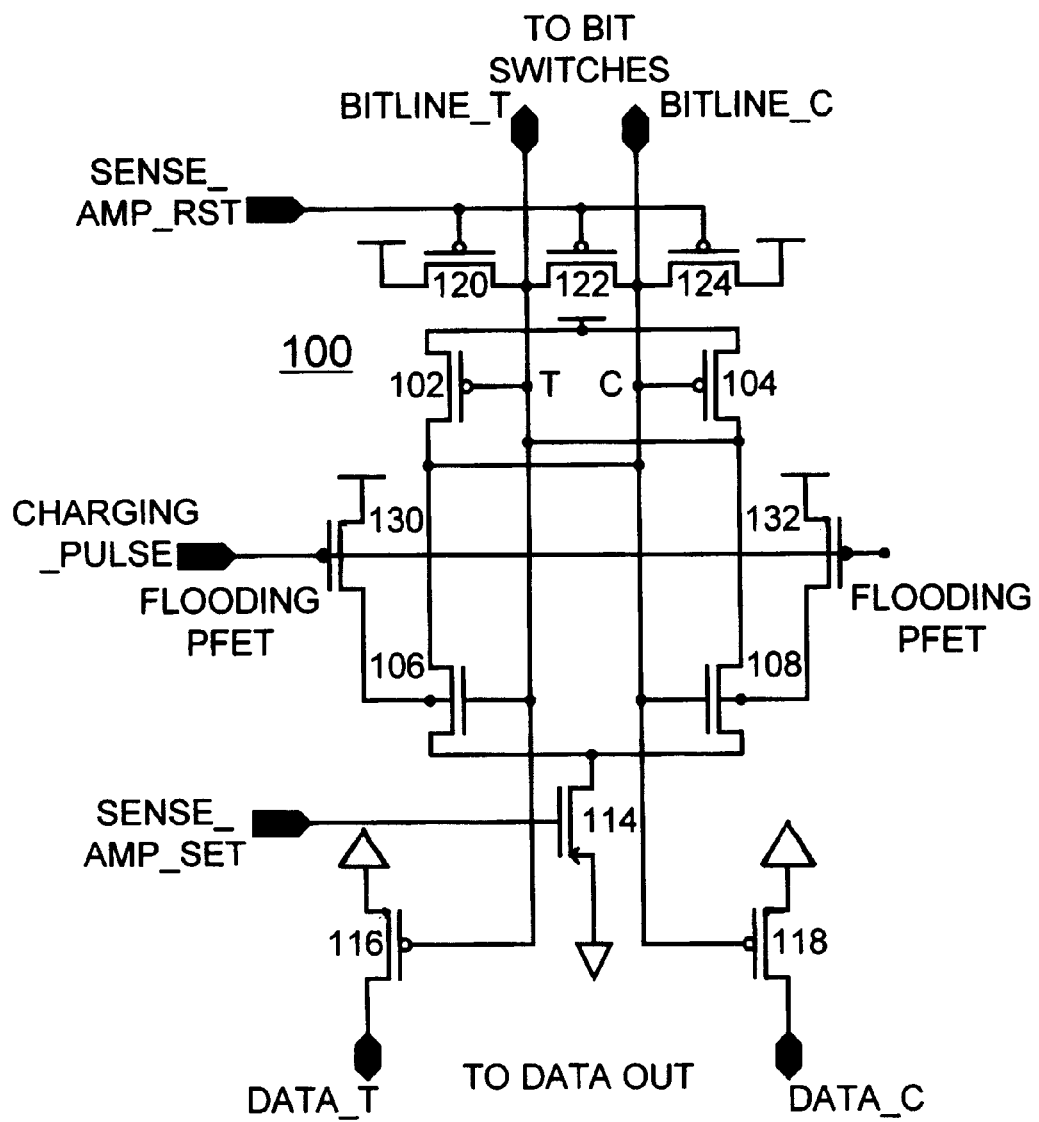
FIG. 3 is a schematic diagram illustrating a SOI CMOS sense amplifier circuit of the preferred embodiment.

Having reference now to the drawings, in FIG. 3, there is shown a SOI CMOS sense amplifier circuit of the preferred embodiment generally designated by the reference character 100. As shown in FIG. 3, SOI CMOS sense amplifier 100 includes a pair of P-channel field effect transistors (PFETs) 102 and 104 respectively connected between a voltage supply Vdd and a pair of N-channel field effect transistors (NFETs) 106 and 108. A gate of PFET 102 and NFET 106 is connected to a Bitline_T. A gate of PFET 104 and NFET 108 is connected to a Bitline_C. An NFET 114 connected between NFETs 106 and 108 and ground, receives a gate input of sense_amp_set. A pair of P-channel field effect transistors (PFETs) 116 and 118 having a respective gate input of Bitline_T and Bitline_C, are respectively connected between ground and data out, Data_T and Data_C. A gate input of sense_amp_rst is applied to a gate of PFETs 120, 122 and 124. PFETs 120 and 124 are respectively connected between voltage supply Vdd and Bitline_T or Bitline_C. PFET 120 is connected between Bitline_T and Bitline_C.

In accordance with the preferred embodiment, the concerned FETs are body-contacted through a small flooding FET of the opposite polarity which provides a charging path to a power rail. A pair of small P-channel field effect transistors (PFETs) 130 and 132 respectively provide a charging path for body-contacted NFETs 106 and 108 to a power rail. PFETs 130 and 132 are connected between the power rail Vdd and a body of respective NFETs 106 and 108. A charging_pulse is applied to a gate of PFETs 130 and 132. PFETs 130 and 132 serve as the charging to power rail Vdd elements for the body-contacted NFETs 106 and 108 on both sides of the complementary bitline structures. It should be understood that in cases where PMOS device floating body effects are non-negligible, a complementary charging to ground structure advantageously can be provided.

In accordance with the preferred embodiment, by flooding the FET body or charging the FET body up to a voltage rail through an opposite polarity FET, matching device characteristics can be achieved or restored every time the sense amplifier is activated. This technique, instead of emptying the body of charges, has the advantage of retaining true and predictable low transistor threshold voltage Vt operation. Since the concerned FET bodies are symmetrically charged up to a known voltage rail whenever a read operation is anticipated, undesirable floating body uncertainties typical of the SOI application are also minimized. By consistently boosting concerned FET bodies to the same elevated voltage, operation always start with a high-performance sensing cycle with bodies well disposed.

Charging_pulse control to the charging action of PFETs 130 and 132 is provided by the input to the gate of each flooding PFET 130 and 132. Charging_pulse is a signal enabled prior to the sense amplifier 100 being set. Charging_pulse is a pulse, which can be easily derived from the sense amplifier reset/restore signal (sense_amp_rst). The pulse width of the charging_pulse is relatively non-critical, as long as it does not vanish. For example, the rising edge of sense_amp_rst can be used to trigger the start of the charging_pulse and count/use a fixed amount of delay to end the charging_pulse.

In accordance with the preferred embodiment, to start the operation of sense amplifier 100, the bodies of NFETs 106 and 108 are fully flooded when offset potential difference starts to develop in the complementary bitlines. Then the bodies of NFETs 106 and 108 are let go to take their own course when the sense amplifier 100 is fired, when sense_amp_set goes to high and goes into its high gain region.

FIGS. 4A, 4B, 4C, 5, 6 and 7 provide simulations to understand the operation of the sense amplifier 100 of the preferred embodiment.

Figure 4A:
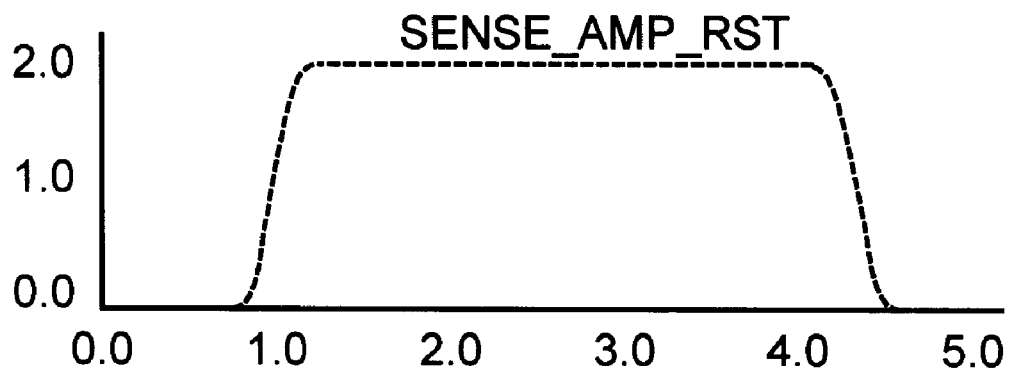
FIGS. 4A, 4B, and 4C are charts illustrating a basic charging pulse arrangement in relation to sense_amp_rst and sense_amp_set signals in accordance with the preferred embodiment.
Figure 4B:
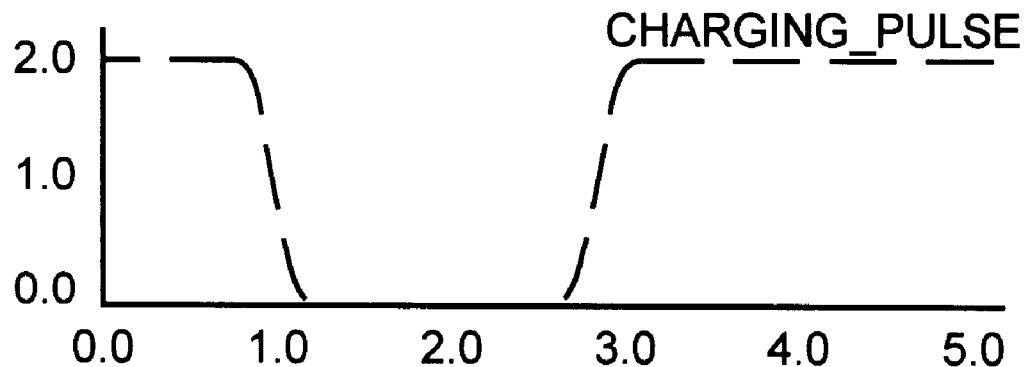
Figure 4C:
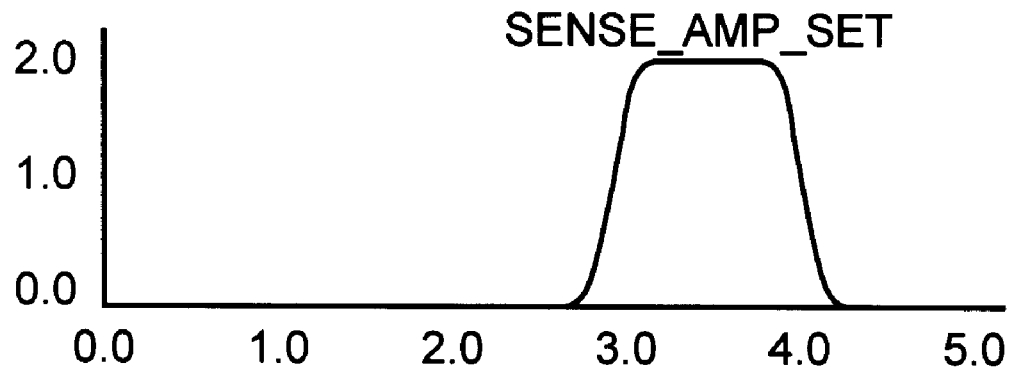

FIGS. 4A, 4B, and 4C are charts illustrating a basic charging pulse arrangement in relation to sense_amp_rst and sense_amp_set signals in accordance with the preferred embodiment. The signal sense_amp_rst is shown in FIG. 4A followed by charging_pulse shown in FIG. 4B and sense_amp_set is shown in FIG. 4C. As shown in FIGS. 4A, 4B, and 4C, the rising edge of sense_amp_rst is used to trigger the start of the charging_pulse and a fixed amount of delay is used to end the charging_pulse.

Figure 5:
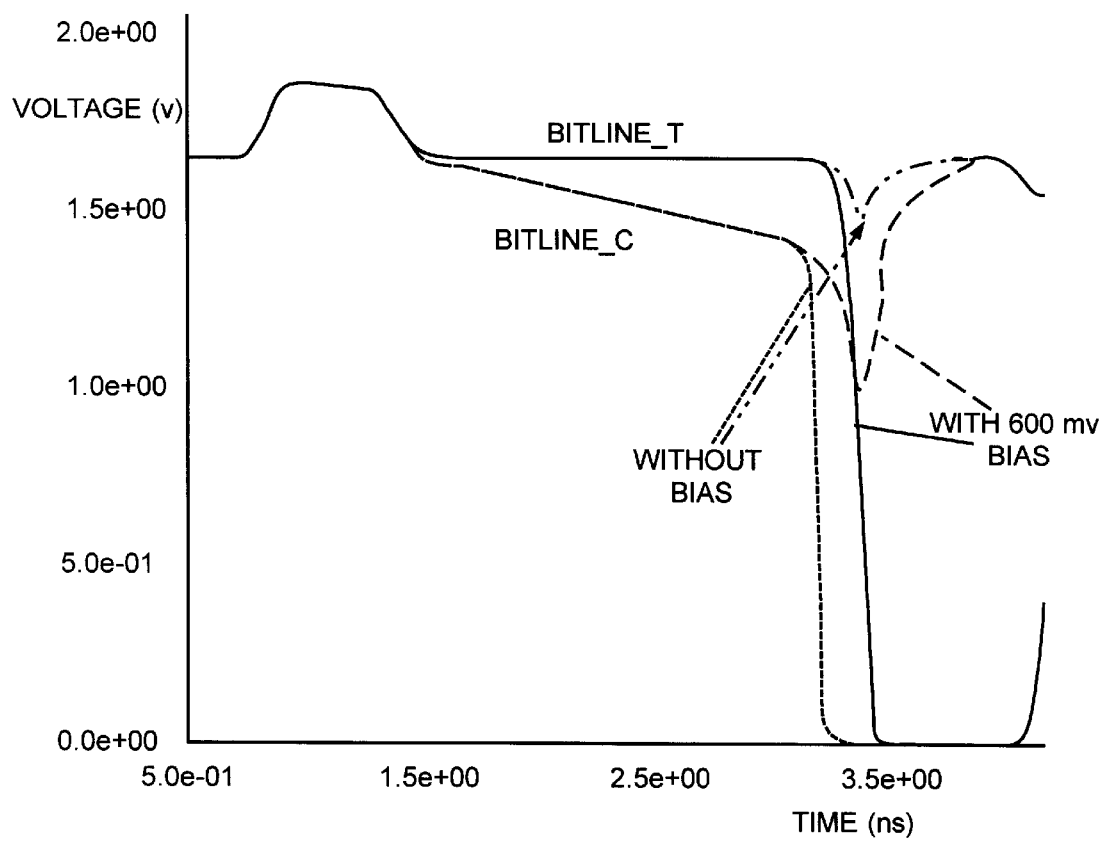
FIG. 5 is a chart illustrating bitline voltage waveforms for a conventional sense amplifier having 0 and 600 mV initial NFET body voltage bias.

FIG. 5 is a chart illustrating bitline voltage waveforms for a conventional sense amplifier having 0 and 600 mV initial NFET body voltage bias. Cross over curves in the 600 mV bias case indicate a sensing action failure.

Figure 6:
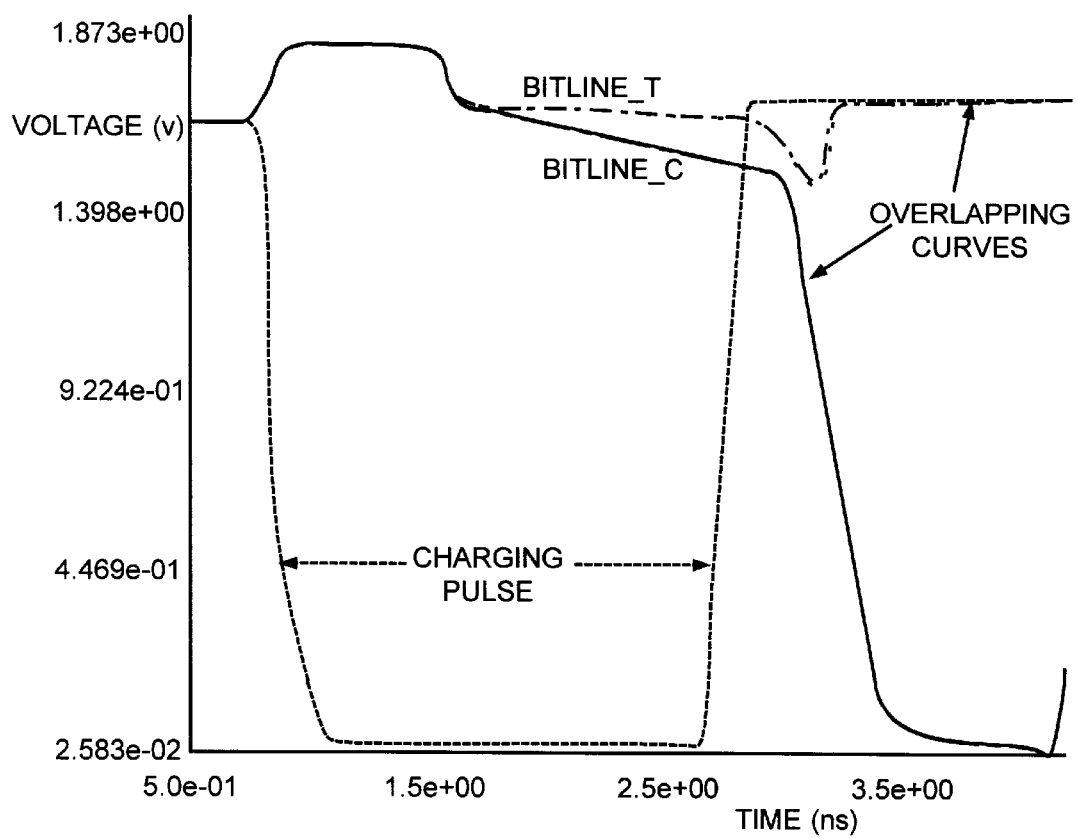
FIG. 6 is a chart illustrating bitline voltage waveforms for the sense amplifier of FIG. 3 in accordance with the preferred embodiment and having 0 and 600 mV initial NFET body voltage bias.

FIG. 6 is a chart illustrating bitline voltage waveforms for the sense amplifier 100 of FIG. 3 in accordance with the preferred embodiment and having 0 and 600 mV initial body voltage difference between FET 106 and FET 108. The body charge control signal charging_pulse to the PFETs 130 and 132 is shown in dotted line.

Figure 7:
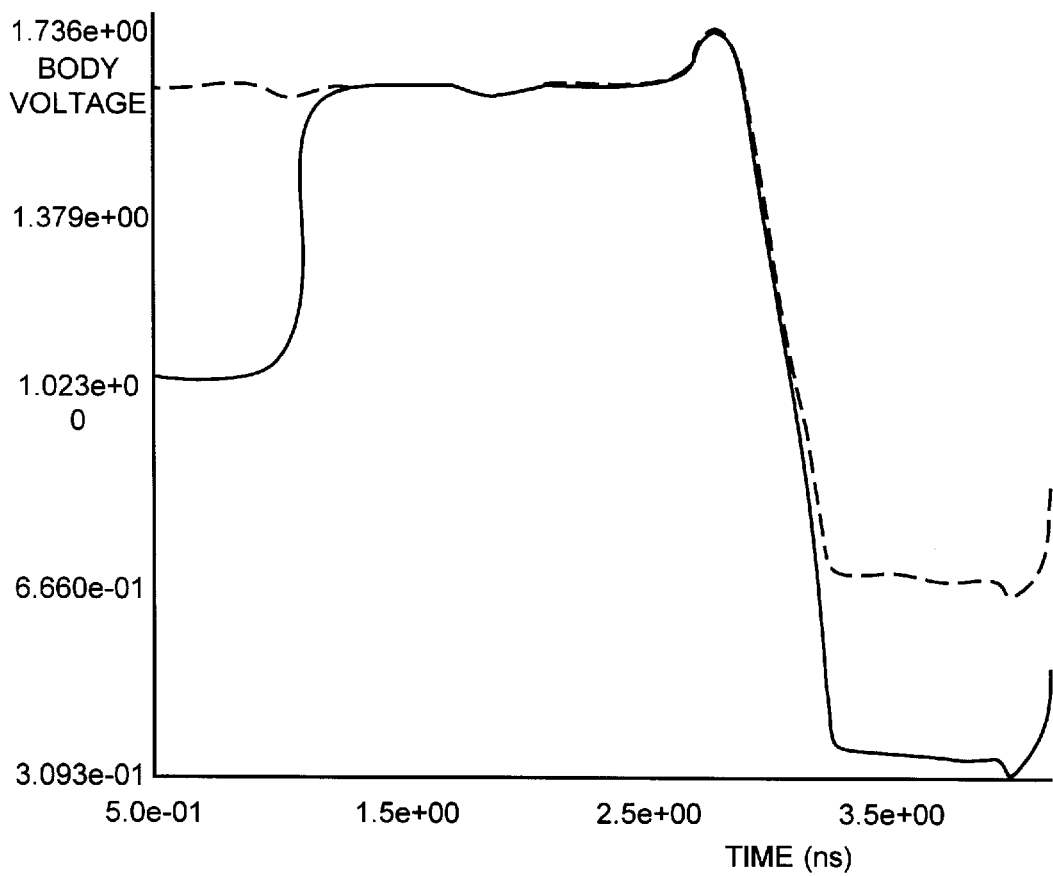
FIG. 7 is a chart illustrating body voltage trajectories or waveforms for the sense amplifier of FIG. 3 in accordance with the preferred embodiment and having 600 mV initial NFET body voltage bias.

FIG. 7 is a chart illustrating body voltage trajectories or waveforms for FET 106 and FET 108 of the sense amplifier 100 of FIG. 3 in accordance with the preferred embodiment and having 600 mV initial NFET body voltage bias. The body voltages for the FET 106 and FET 108 are equalized well before complementary bitlines are fired resulting in matching characteristics for sensing.

While a 600 mV body potential mismatch fails the conventional sense amplifier as shown in FIG. 5, this poses neither matching characteristic degradation nor performance degradation for the sense amplifier 100 of the preferred embodiment as illustrated in FIG. 6. In FIG. 7, note both FET bodies are quickly equalized to Vdd. Once this equalization is completed, the charging pulse can be stopped. The example pulse width in FIG. 4 can be substantially reduced without having any impact on the performance of sense amplifier 100.

While the present invention has been described with reference to the details of the embodiments of the invention shown in the drawing, these details are not intended to limit the scope of the invention as claimed in the appended claims.

What is claimed is:

1. A sense amplifier comprising:
   a silicon-on-insulator (SOI) field effect transistor; and
   a flooding field effect transistor coupled to a body of said silicon-on-insulator (SOI) field effect transistor; said flooding field effect transistor being activated before the sense amplifier is set.

2. A sense amplifier as recited in claim 1 wherein said flooding field effect transistor has an opposite polarity of the silicon-on-insulator (SOI) field effect transistor.

3. A sense amplifier as recited in claim 1 wherein said flooding field effect transistor provides a charging path to a voltage supply rail.

4. A sense amplifier as recited in claim 1 wherein said flooding field effect transistor is substantially smaller than said silicon-on-insulator (SOI) field effect transistor.

5. A sense amplifier as recited in claim 1 includes a pair of said silicon-on-insulator (SOI) field effect transistors on each side of complementary bitline structures of the sense amplifier.

6. A sense amplifier as recited in claim 5 includes a pair of said flooding field effect transistors coupled to said pair of said silicon-on-insulator (SOI) field effect transistors.

7. A sense amplifier as recited in claim 1 wherein said silicon-on-insulator (SOI) field effect transistor is an N-channel field effect transistor (NFET).

8. A sense amplifier as recited in claim 7 wherein said flooding field effect transistor is a P-channel field effect transistor (PFET).

9. A sense amplifier as recited in claim 8 wherein said flooding P-channel field effect transistor provides a charging path to a voltage supply rail.

10. A sense amplifier as recited in claim 9 wherein said flooding P-channel field effect transistor is substantially smaller than said silicon-on-insulator (SOI) N-channel field effect transistor.

11. A method for implementing enhanced operation of a sense amplifier including a silicon-on-insulator (SOI) field effect transistor, said method comprising the steps of:

providing a flooding field effect transistor coupled to a body of the silicon-on-insulator (SOI) field effect transistor; and activating said flooding field effect transistor before the sense amplifier is set.

12. A method for implementing enhanced operation of a sense amplifier as recited in claim 11 wherein the step of providing a flooding field effect transistor coupled to a body of the silicon-on-insulator (SOI) field effect transistor includes the step of connecting said flooding field effect transistor between a voltage supply rail and said body of the silicon-on-insulator (SOI) field effect transistor.

13. A method for implementing enhanced operation of a sense amplifier as recited in claim 11 wherein the step of activating said flooding field effect transistor before the sense amplifier is set includes the step of applying a charging pulse to a gate of said flooding field effect transistor.

* * * * *